United States Patent
Watabe et al.

(10) Patent No.: US 12,431,348 B2
(45) Date of Patent: Sep. 30, 2025

(54) METHOD FOR PRODUCING A CRYSTALLINE OXIDE SEMICONDUCTOR FILM AND A GALLIUM OXIDE FILM, AND A METHOD FOR PRODUCING A VERTICAL SEMICONDUCTOR DEVICE

(71) Applicant: SHIN-ETSU CHEMICAL CO., LTD., Tokyo (JP)

(72) Inventors: Takenori Watabe, Annaka (JP); Hiroshi Hashigami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 624 days.

(21) Appl. No.: 17/795,092

(22) PCT Filed: Dec. 17, 2020

(86) PCT No.: PCT/JP2020/047079
§ 371 (c)(1),
(2) Date: Jul. 25, 2022

(87) PCT Pub. No.: WO2021/157215
PCT Pub. Date: Aug. 12, 2021

(65) Prior Publication Data
US 2023/0089169 A1 Mar. 23, 2023

(30) Foreign Application Priority Data

Feb. 6, 2020 (JP) .................... 2020-018915
Aug. 12, 2020 (JP) .................... 2020-136430

(51) Int. Cl.
*H01L 21/02* (2006.01)
*C30B 25/18* (2006.01)

(52) U.S. Cl.
CPC ........ *H01L 21/02172* (2013.01); *C30B 25/18* (2013.01); *H01L 21/02271* (2013.01)

(58) Field of Classification Search
CPC ......... H01L 21/02172; H01L 21/02271; H01L 21/0242; H01L 21/02565; C30B 25/18; C30B 29/16; C23C 16/01; C23C 16/40
See application file for complete search history.

(56) References Cited

U.S. PATENT DOCUMENTS

2017/0200790 A1    7/2017  Hitora et al.
2017/0372965 A1*  12/2017  Nishibayashi ..... H10D 62/8303
2018/0371642 A1*  12/2018  Adachi ................... C30B 29/16

FOREIGN PATENT DOCUMENTS

CN     109119530 A    1/2019
JP     2016-082232 A  5/2016
(Continued)

OTHER PUBLICATIONS

Jan. 13, 2025 Examination Report issued in Indian Patent Application No. 202247042720.
(Continued)

*Primary Examiner* — Julia Slutsker
(74) *Attorney, Agent, or Firm* — Oliff PLC (57) ABSTRACT

A method for producing a crystalline oxide semiconductor film in which, a crystalline oxide semiconductor layer and a light absorbing layer are laminated on a substrate, the light absorbing layer is irradiated with light to decompose the light absorbing layer and separate the crystalline oxide semiconductor layer and the substrate to produce a crystalline oxide semiconductor film. This provides a method for industrially advantageously producing a crystalline oxide semiconductor film, for example, a crystalline oxide semiconductor film useful for a semiconductor device (particularly a vertical element).

14 Claims, 4 Drawing Sheets

(56) References Cited

FOREIGN PATENT DOCUMENTS

| JP | 2017-022188 A | 1/2017 |
|----|---------------|--------|
| JP | 2019-006664 A | 1/2019 |
| WO | 2016/114382 A1 | 7/2016 |
| WO | 2019/004469 A1 | 1/2019 |

OTHER PUBLICATIONS

Oct. 23, 2023 Office Action issued in Chinese Patent Application No. 202080095445.6.
Feb. 16, 2021 International Search Report issued in International Patent Application No. PCT/JP2020/047079.
Mar. 9, 2021 Office Action issued in Japanese Patent Application No. 2020-136430.
Jun. 8, 2021 Office Action issued in Japanese Patent Application No. 2020-136430.
Jul. 28, 2022 International Report on Patentability issued in International Patent Application No. PCT/JP2020/047079.
Jun. 27, 2024 Office Action issued in Korean Patent Application No. 10-2022-7025472.
Dec. 21, 2023 extended Search Report issued in European Patent Application No. 20917770.8.

\* cited by examiner

METHOD FOR PRODUCING A CRYSTALLINE OXIDE SEMICONDUCTOR FILM AND A GALLIUM OXIDE FILM, AND A METHOD FOR PRODUCING A VERTICAL SEMICONDUCTOR DEVICE

TECHNICAL FIELD

The present invention relates to a method for producing a crystalline oxide semiconductor film and a gallium oxide film, which are useful for semiconductor devices and the like. The present invention also relates to a method for producing a vertical semiconductor device.

BACKGROUND ART

As a next generation switching element capable of achieving high breakdown voltage, low loss, and high heat resistance, semiconductor devices using gallium oxide with a large bandgap are attracting attention, and are expected to be applied to power semiconductor devices such as inverters. Moreover, due to the wide bandgap, it is expected to be applied as a light emitting/receiving devices such as an LED or a sensor. A sapphire substrate has been mainly studied as a base material used to realize a semiconductor device using such a gallium oxide based semiconductor.

When a sapphire substrate is used, there is a problem that an electric current cannot flow through the base material because the sapphire is an insulator. In this case, an electrode cannot be formed on the base material, and the output current per unit area of the semiconductor device is limited. In addition, the low thermal conductivity of sapphire is also a problem of heat generation and high temperature operation due to the increase in current of semiconductor devices.

Furthermore, the characteristics of the base material also cause problems in electrical characteristics for realizing a low-loss semiconductor device. For example, in a vertical semiconductor device, it is required to reduce the loss of the base material and the layer between the base material and the channel layer.

In addition, with the development of mobile devices or the like, there is a demand for miniaturization of semiconductor devices against the background of improvement in processing capacity per unit volume of information processing terminals, and there is also market demand to reduce the number of semiconductor devices by combining semiconductor devices having different functions. Here, there is a strong demand for combining with a semiconductor device or a substrate using silicon, which is overwhelmingly advanced in industrial applications.

From the above background, the technique of peeling gallium oxide from the sapphire substrate is one of the solutions. As a peeling method, Patent Document 1 discloses a method of changing the film formation temperature. Although this method is easy to carry out, there is a fatal problem that the substrate warps or cracks during film formation due to the difference in the thermal expansion coefficient between the film and the substrate. Further, Patent Document 2 discloses a peeling method by laser irradiation. However, there is a problem that the effect cannot be obtained for the gallium oxide film and the sapphire substrate, which are transparent to a wavelength range of the laser.

As described above, even when a sapphire substrate whose crystal growth technology has been proven so far is used, it has been difficult to replace the base material or the like.

CITATION LIST

Patent Literature

Patent Document 1: JP 2017-22188 A
Patent Document 2: JP 2016-82232 A

SUMMARY OF INVENTION

Technical Problem

An object of the present invention is to provide a method for industrially advantageously producing a crystalline oxide semiconductor film, for example, a crystalline oxide semiconductor film useful for a semiconductor device (particularly a vertical element). Another object of the present invention is to provide a method for industrially advantageously producing a gallium oxide film, for example, a crystalline gallium oxide semiconductor film useful for a semiconductor device (particularly a vertical element).

Solution to Problem

The present invention has been made to achieve the above object, and provides a method for producing a crystalline oxide semiconductor film wherein, a crystalline oxide semiconductor layer and a light absorbing layer are laminated on a substrate, the light absorbing layer is irradiated with light to decompose the light absorbing layer and separate the crystalline oxide semiconductor layer and the substrate to produce a crystalline oxide semiconductor film.

According to the production method of the present invention, the crystalline oxide semiconductor layer can be easily separated (peeled) from the substrate, and the crystalline oxide semiconductor film can be industrially advantageously produced.

Further, the light to be irradiated can be a laser light or a flash lamp light.

As a result, the crystalline oxide semiconductor film can be peeled off with good productivity.

Further, the diameter of the substrate can be 50 mm or more.

This makes it possible to obtain a crystalline oxide semiconductor film having a large area.

The crystalline oxide semiconductor layer can be a gallium oxide layer.

As a result, the gallium oxide layer can be easily separated (peeled) from the substrate, and the gallium oxide film can be industrially advantageously produced.

The present invention also provides a method for producing a gallium oxide film, wherein,
  to a substance in which an iron (III) oxide layer and a gallium oxide layer are formed in this order by a mist CVD method on the surface of a substrate having a single crystal structure, light is irradiated to cause separation between the gallium oxide layer and the substrate at the iron (III) oxide layer,
  and the gallium oxide film is produced by the separation of the gallium oxide layer.

According to the production method of the present invention, the gallium oxide layer can be easily separated (peeled) from the substrate, and the gallium oxide film can be industrially advantageously produced. In particular, in the case of a crystalline gallium oxide layer, the gallium oxide layer can be easily peeled off from the substrate while maintaining high crystallinity.

Further, since the gallium oxide layer or the like is formed by the mist CVD method, it is advantageous in terms of cost.

The gallium oxide layer (gallium oxide film) in the present invention means a metal oxide layer (film) in which the main component of the contained metal is gallium, and other metal components can also be contained.

Further, the iron (III) oxide layer also means a metal oxide layer in which the main component of the contained metal is iron (III), and other metal components can also be contained.

Further, the thickness of the iron (III) oxide layer can be set to 1 to 500 nm.

By doing so, the peeling effect can be obtained more easily while maintaining the crystallinity of the gallium oxide film.

Further, the light to be irradiated may include light having a wavelength of 600 nm or less.

As a result, the gallium oxide film can be peeled off more efficiently.

Further, the light to be irradiated can be a laser light or a flash lamp light.

As a result, the gallium oxide film can be peeled off with high productivity.

Further, the diameter of the substrate can be 50 mm or more.

This makes it possible to obtain a gallium oxide film having a large area.

Further, the present invention provides a method for producing a vertical semiconductor device which comprises producing a vertical semiconductor device using the crystalline oxide semiconductor film produced by the method for producing a crystalline oxide semiconductor film of the present invention, or the gallium oxide film produced by the method for producing a gallium oxide film of the present invention.

This makes it possible to industrially advantageously manufacture a vertical semiconductor device.

Advantageous Effects of Invention

As described above, according to the method for producing a crystalline oxide semiconductor film of the present invention, a crystalline oxide semiconductor film, for example, a crystalline oxide semiconductor film useful for a semiconductor device (particularly a vertical element) can be industrially produced in an advantageous manner. A crystalline oxide semiconductor film can be easily manufactured, and it is also advantageous in terms of cost.

Further, according to the method for producing a gallium oxide film of the present invention, a gallium oxide film, for example, a crystalline gallium oxide semiconductor film useful for a semiconductor device (particularly a vertical element) can be industrially produced in an advantageous manner. The gallium oxide film can be easily manufactured, and it is also advantageous in terms of cost.

Further, according to the method for producing a vertical semiconductor device of the present invention, a vertical semiconductor device can be industrially produced in an advantageous manner.

DESCRIPTION OF EMBODIMENTS

Hereinafter, the present invention will be described in detail, but the present invention is not limited thereto.

As a result of diligent studies, the inventors of the present invention have found that by a method for producing a crystalline oxide semiconductor film wherein, a crystalline oxide semiconductor layer and a light absorbing layer are laminated on a substrate, the light absorbing layer is irradiated with light to decompose a part of the light absorbing layer and separate the crystalline oxide semiconductor layer and the substrate to produce a crystalline oxide semiconductor film, the crystalline oxide semiconductor film can be easily peeled off from the substrate to obtain a crystalline oxide semiconductor film and this is an industrially advantageous manufacturing method, and have completed the invention.

A detailed explanation will be given below with reference to the drawings.

Figure 6:
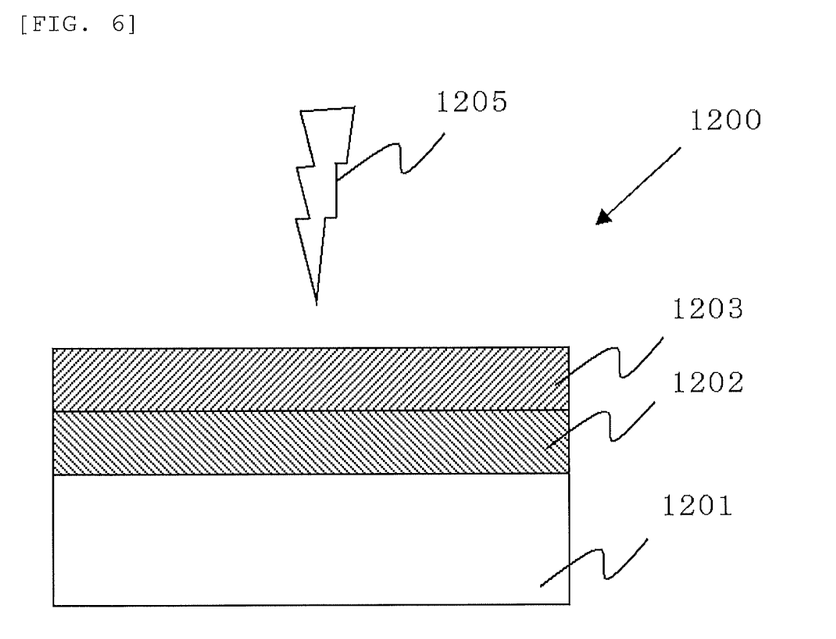
FIG. 6 is a schematic diagram showing an example of a substance (a substrate, a light absorbing layer, a crystalline oxide semiconductor layer) before separating the crystalline oxide semiconductor film in the method for producing a crystalline oxide semiconductor film according to the present invention.

FIG. 6 shows an example of a substance (a substrate, a light absorbing layer, a crystalline oxide semiconductor layer) before separating the crystalline oxide semiconductor film in the method for producing a crystalline oxide semiconductor film of the present invention.

The substance 1200 has a substrate 1201, a light absorbing layer 1202, and a crystalline oxide semiconductor layer 1203. Hereinafter, each part will be described in detail.

(Substrate)

The substrate 1201 is not particularly limited as long as a light absorbing layer 1202 and a crystalline oxide semiconductor layer 1203 can be formed on the surface thereof and it can support these layered films. As the substrate 1201, it can be selected from, for example, oxides such as sapphire, barium titanate, cobalt oxide, chromium oxide, copper oxide, dysprosium scandate, diiron trioxide, triiron tetraoxide, gadolinium scandate, lithium tantalate, potassium tantalate, lanthanum aluminum oxide, lanthanum strontium aluminate, lanthanum strontium gallate, lanthanum strontium aluminum tantalate, magnesium oxide, spinel, manganese oxide, nickel oxide, rock crystal, scandium magnesium aluminate, strontium oxide, strontium titanate, tin oxide, tellurium oxide, titanium oxide, YAG, yttria-stabilized zirconia, yttrium aluminate, zinc oxide, or the like, silicon, germanium, silicon carbide, graphite, mica, calcium fluoride, and metals such as silver, aluminum, gold, copper, iron, nickel, titanium, tungsten, zinc or the like, but it is not limited to these.

As an example of the substrate referred to here, a free-standing film or the like can be mentioned, and a free-standing gallium oxide film, a plate-shaped gallium oxide film, or a substrate having a gallium oxide film can also be used.

The substrate may be polycrystalline or amorphous, but is preferably a single crystal.

The thickness of the substrate 1201 is not particularly limited, but is preferably 10 to 2000 μm, and more preferably 50 to 800 μm. The surface area of the substrate is preferably 100 mm$^2$ or more, more preferably 2 inches (50 mm) or more in diameter. It is preferable to use such a large-area substrate because a crystalline oxide semiconductor film having a large area can be finally obtained. Since the larger the diameter of the substrate becomes, the larger the area of the crystalline oxide semiconductor film can be obtained, which is preferable, the upper limit of the diameter of the substrate cannot be determined.

(Crystalline Oxide Semiconductor Layer)

In the present invention, the crystalline oxide semiconductor layer 1203 is not particularly limited, and a metal oxide layer can be mentioned as an example thereof. More specifically, it preferably contains a crystalline oxide semiconductor containing one or more elements selected from indium, aluminum and gallium as a main component, from the viewpoint of further improvement in heat dissipation and breakdown voltage when used in a device. The main component referred to here means that 50 to 100% of the metal components are contained, and other metal components may be contained. The crystalline oxide semiconductor layer 1203 may be single crystal, polycrystal, or amorphous, but a single crystal is preferable. The film thickness is preferably 0.1 to 50 μm.

(Light Absorbing Layer)

In the present invention, the light absorbing layer 1202 is a layer that absorbs light irradiated from the outside and decomposes itself. It is preferable that there is a large difference in absorption coefficient or band gap from any of the substrate 1201 and the crystalline oxide semiconductor layer 1203. From the viewpoint of crystal growth, it is preferable that the crystal structure and lattice constant are close to those of the substrate 1201 and the crystalline oxide semiconductor layer 1203. When the crystalline oxide semiconductor layer 1203 contains a crystalline oxide semiconductor containing one or more elements selected from indium, aluminum and gallium as a main component, metal oxides such as $Cr_2O_3$, $Ir_2O_3$, $Fe_2O_3$, $Rh_2O_3$, $V_2O_3$, $Ti_2O_3$, or the like are preferably used, and mixed crystals containing these as main components may be used. The main component referred to here means that 50 to 100% of the metal components are contained, and other metal components may be contained. The light absorbing layer 1202 may be single crystal, polycrystal, or amorphous, but a single crystal is preferable. The film thickness is appropriately determined, but is preferably 1 to 500 nm.

(Substance)

In the substance 1200 used in the present invention, at least the light absorbing layer 1202 and the crystalline oxide semiconductor layer 1203 are formed on the substrate 1201 in this order.

As long as this order is maintained, another layer may be formed between the layers. That is, between the substrate 1201 and the light absorbing layer 1202, and between the light absorbing layer 1202 and the crystalline oxide semiconductor layer 1203, for example, aluminum oxide, gallium oxide, indium oxide, chromium oxide, iron oxide, and a mixed crystal thereof, etc. may be formed.

Further, another layer may be formed on the crystalline oxide semiconductor film 1203.

In the peeling step in the present invention described in detail later, any structure may be used as long as the light irradiating the substance 1200 can reach the light absorbing layer 1202 from the substrate 1201 side or the crystalline oxide semiconductor layer 1203 side.

In the method for producing a crystalline oxide semiconductor film of the present invention with respect to such a substance 1200, the crystalline oxide semiconductor layer 1203 and the substrate 1201 are separated by a light absorbing layer 1202 by irradiation with light. Hereinafter, this separation (peeling) step will be described in detail.

(Peeling)

As shown in FIG. 6, for example, the substance 1200 is irradiated with light (irradiation light 1205) from the crystalline oxide semiconductor layer 1203 side.

As the light source of the irradiation light 1205, a halogen lamp, a low pressure discharge lamp, a high pressure discharge lamp or the like may be used, but it is preferable that a laser or a flash lamp can give a high energy density in a short time on the substance 1200, particularly the light absorbing layer 1202. If the laser light or the flash lamp light is used, the peeling step can be performed with high productivity.

As the laser source, a second harmonic of such as a YAG system, a $YVO_4$ system, a $GdVO_4$ system or the like can be used. The substrate temperature at the time of the laser irradiation may be room temperature, but may be raised to 100 to 500° C. By heating, thermal expansion during film formation is alleviated, and there is no risk of thermal strain, cracks, or the like. The laser conditions can be appropriately determined, and for example, an output power can be 0.01 to 20 W, a frequency can be 10 to 500 kHz, a galvo head can be provided, and a scanning speed can be 1 to 5000 mm/sec.

The flash lamp can have a substrate temperature of room temperature to 300° C. and a processing time of 0.01 to 1000 milliseconds, for example. Since the flash lamp can effectively heat-treat a large area in a short time, there is no possibility of thermal strain, cracks, or the like.

The irradiation light 1205 may be irradiated from the upper side of the substance 1200 as described above, that is, from the crystalline oxide semiconductor layer 1203 side as shown in FIG. 6, and when the substrate 1201 is transparent, the substrate 1201 side, that is, it may be irradiated from the bottom in FIG. 6. By this method, the crystalline oxide semiconductor layer 1203 can be easily separated from the substrate 1201 to obtain a crystalline oxide semiconductor film.

Figure 7:
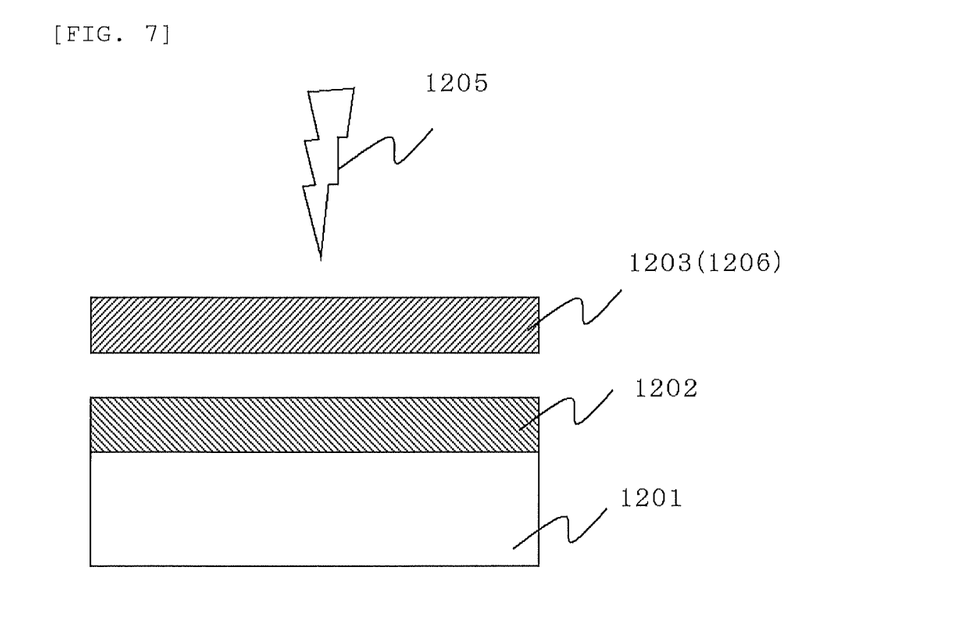
FIG. 7 is an explanatory diagram showing a state of separation between the crystalline oxide semiconductor layer and the substrate by light irradiation from the crystalline oxide semiconductor layer side.
Figure 8:
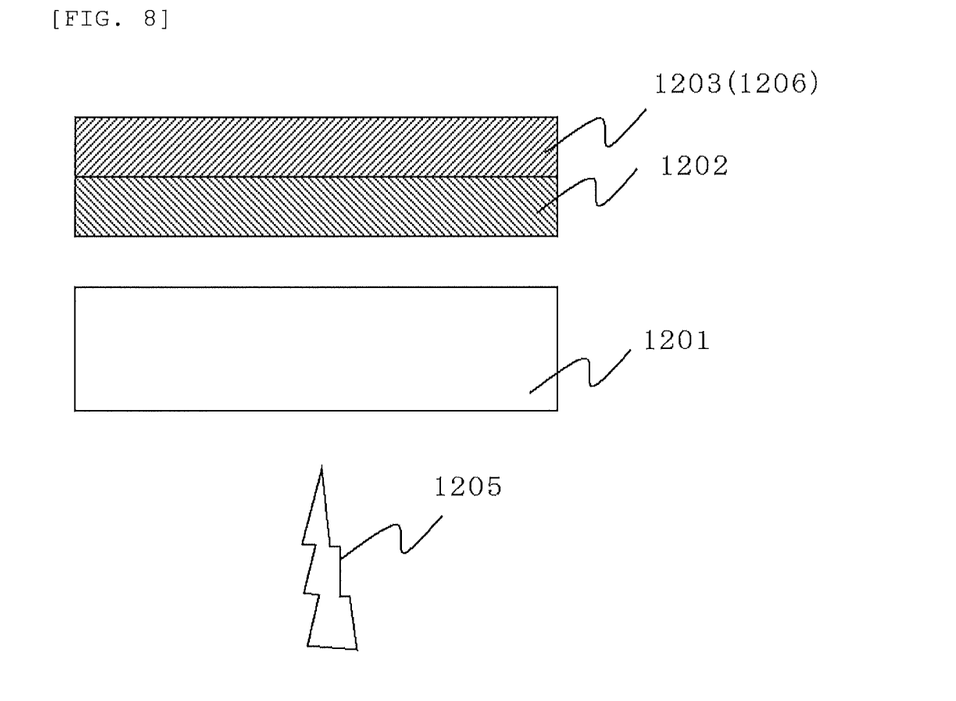
FIG. 8 is an explanatory diagram showing a state of separation between a crystalline oxide semiconductor layer and a substrate by light irradiation from the substrate side.

FIGS. 7 and 8 show the state of separation of this crystalline oxide semiconductor film.

In the former case, as shown in FIG. 7, the portion of the light absorbing layer 1202 on the crystalline oxide semiconductor layer 1203 side absorbs the irradiation light 1205 and is decomposed into metal or a metal oxide having a reduced oxidation number and oxygen, the crystalline oxide semiconductor layer 1203 is peeled off from the substrate 1201 to produce the crystalline oxide semiconductor film 1206.

On the other hand, in the latter case, as shown in FIG. 8, the portion of the light absorbing layer 1202 on the substrate 1201 side absorbs the irradiation light 1205 and is decomposed into a metal or a metal oxide having a reduced oxidation number and oxygen, the crystalline oxide semiconductor layer 1203 is peeled off from the substrate 1201 together with the light absorbing layer 1202 to produce a crystalline oxide semiconductor film 1206 with a light absorbing layer. The attached light absorbing layer may be removed if necessary.

It is also possible to perform the light irradiation treatment after adhering another substrate supporting the crystalline oxide semiconductor film 1206 to the crystalline oxide semiconductor layer 1203 in advance before peeling. By doing so, the substrate can be replaced.

In the present invention, the crystalline oxide semiconductor film 1206 obtained as described above can be used in a semiconductor device. When the crystalline oxide semiconductor film 1206 of the present invention is used in a semiconductor device, the crystalline oxide semiconductor film 1206 of the present invention may be used as it is in the semiconductor device, or another layer (for example, an insulator layer, a semi-insulator layer, a conductor layer, a semiconductor layer, a buffer layer or other intermediate layer, etc.) may be formed.

The crystalline oxide semiconductor film 1206 of the present invention is useful for various semiconductor devices, and is particularly useful for power devices. Semiconductor devices are classified into horizontal elements (horizontal devices) in which electrodes are formed on one side of the semiconductor layer and vertical elements (vertical devices) in which electrodes are provided on both front and back sides of the semiconductor layer. In the present invention, the crystalline oxide semiconductor film 1206 can be suitably used for both horizontal and vertical devices, but it is particularly preferable to use the crystalline oxide semiconductor film 1206 for vertical devices. As examples of the semiconductor device, a schottky barrier diode (SBD), a metal semiconductor field effect transistor (MESFET), a high electron mobility transistor (HEMT), a metal oxide semiconductor field effect transistor (MOSFET), an static induction transistor (SIT), junction field effect transistor (JFET), insulated gate type bipolar transistor (IGBT), light emitting diode or the like can be mentioned. In the present invention, the semiconductor device is preferably an SBD, MOSFET, SIT, JFET or IGBT, and more preferably an SBD, MOSFET or SIT.

In particular, a gallium oxide film can be produced by using the above method. As an example, the case where the crystalline oxide semiconductor layer is a gallium oxide layer (furthermore, the case where the light absorbing layer is particularly an iron (III) oxide layer) can be mentioned. That is, inventors of the present invention have found that by a method for producing a gallium oxide film, wherein, to a substance in which an iron (III) oxide layer and a gallium oxide layer are formed in this order by a mist CVD method on the surface of a substrate having a single crystal structure, light is irradiated to cause separation between the gallium oxide layer and the substrate at the iron (III) oxide layer, a gallium oxide film can be obtained and that it is an industrially advantageous manufacturing method, and have completed the invention. In particular, in the case of a crystalline gallium oxide layer, a gallium oxide film can be easily peeled off while maintaining high crystallinity to obtain a gallium oxide film.

Figure 1:
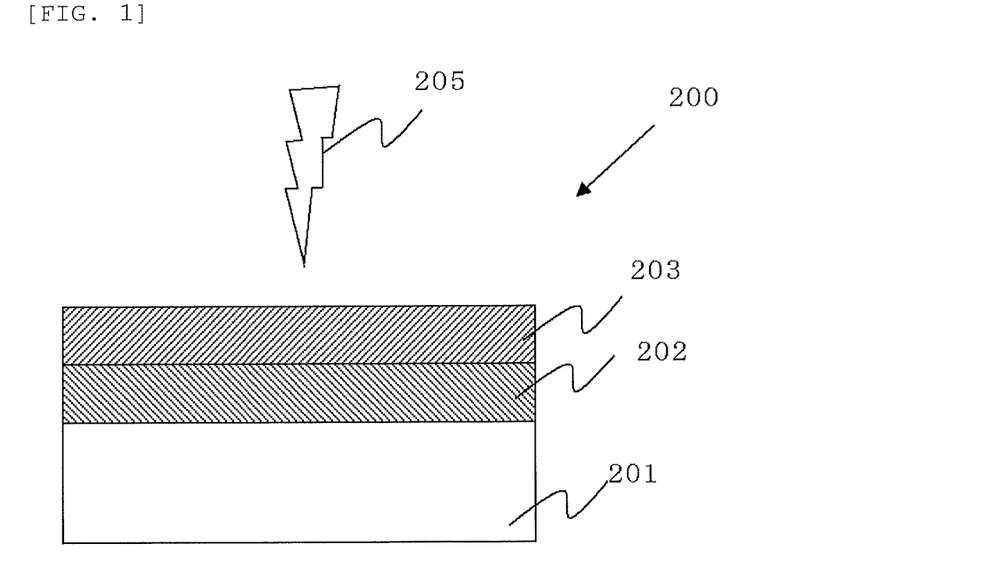
FIG. 1 is a schematic diagram showing an example of a substance (a substrate, an iron (III) oxide layer, and a gallium oxide layer) before separating the gallium oxide layer in the method for producing a gallium oxide film according to the present invention.

FIG. 1 shows an example of a substance (a substrate, an iron (III) oxide layer, and a gallium oxide layer) before separating the gallium oxide layer in the method for producing a gallium oxide film of the present invention.

The substance 200 has a substrate 201, an iron (III) oxide layer 202, and a gallium oxide layer 203. Hereinafter, each part will be described in detail.

(Substrate)

The substrate 201 is not particularly limited as long as it can form an iron (III) oxide layer 202 and a gallium oxide layer 203 on the surface thereof, and can support these layered films, and at least the surface has a single crystal structure. As the substrate 201, a single crystal substrate or a substrate having a single crystal thin film on the surface can be used.

As the substrate, it can be selected a single crystal substrate or one in which a single crystal film is formed on a surface of a substrate, selected from, for example, oxides such as sapphire, barium titanate, cobalt oxide, chromium oxide, copper oxide, dysprosium scandate, diiron trioxide, triiron tetraoxide, gadolinium scandate, lithium tantalate, potassium tantalate, lanthanum aluminum oxide, lanthanum strontium aluminate, lanthanum strontium gallate, lanthanum strontium aluminum tantalate, magnesium oxide, spinel, manganese oxide, nickel oxide, rock crystal, scandium magnesium aluminate, strontium oxide, strontium titanate, tin oxide, tellurium oxide, titanium oxide, YAG, yttria-stabilized zirconia, yttrium aluminate, zinc oxide, or the like, silicon, germanium, silicon carbide, graphite, mica, calcium fluoride, and metals such as silver, aluminum, gold, copper, iron, nickel, titanium, tungsten, zinc or the like, but it is not limited to this.

As an example of the substrate referred to here, a free-standing film or the like can be mentioned, and a free-standing single crystal gallium oxide film, a plate-shaped single crystal gallium oxide film, or a substrate having a single crystal gallium oxide film can be also used.

The thickness of the substrate 201 is not particularly limited, but is preferably 10 to 2000 μm, and more preferably 50 to 800 μm. The surface area of the substrate is preferably 100 mm² or more, more preferably 2 inches (50 mm) or more in diameter. It is preferable to use such a large-area substrate because a large-area gallium oxide film can be finally obtained. Since the larger the diameter of the substrate becomes, the larger the area of the crystalline oxide semiconductor film can be obtained, which is preferable, the upper limit of the diameter of the substrate cannot be determined.

(Gallium Oxide Layer)

As described above, in the present invention, the gallium oxide layer 203 is a layer containing gallium oxide as a main component, and means a metal oxide film in which the main component of the metal is gallium. The main component here means that 50 to 100% of the metal components are gallium, and other metal components may be contained. The gallium oxide layer 203 may be a single crystal, polycrystal, or amorphous, but a single crystal is preferable. The film thickness is preferably 0.1 to 50 μm.

(Iron (III) Oxide Layer)

As described above, in the present invention, the iron (III) oxide layer 202 is a layer containing iron (III) oxide as a main component, and means a metal oxide film in which the main component of the metal is iron (III). The main component referred to here means that 50 to 100% of the metal components are iron (III), and other metal components may be contained. The iron (III) oxide layer 202 may be a single crystal, polycrystal, or amorphous, but a single crystal is preferable.

The film thickness is preferably 1 to 500 nm. With such a film thickness, the peeling effect can be obtained more easily while maintaining the crystallinity of the gallium oxide film.

$\alpha$-$Fe_2O_3$ has a corundum-type crystal structure, which is the same as the crystal structure of $\alpha$-$Ga_2O_3$. Since the lattice constant is also extremely close, it is possible to epitaxially grow $\alpha$-$Ga_2O_3$ on the single crystal $\alpha$-$Fe_2O_3$. Further, $\alpha$-$Fe_2O_3$ is characterized by having a smaller bandgap than $\alpha$-$Ga_2O_3$, and the absorption edge is about 550 nm.

(Substance)

In the substance 200 used in the present invention, at least the iron (III) oxide layer 202 and the gallium oxide layer 203 are formed on the substrate 201 in this order.

As long as this order is maintained, another layer may be formed between the layers. That is, between the substrate 201 and the iron (III) oxide layer 202, and between the iron (III) oxide layer 202 and the gallium oxide layer 203, for example, aluminum oxide, gallium oxide, indium oxide, chromium oxide, iron oxide, and a mixed crystal of these may be formed.

Further, another layer may be formed on the gallium oxide layer 203.

In the peeling step of the present invention described in detail later, any structure may be used as long as the light irradiating the substance 200 can reach the iron (III) oxide layer 202 from the substrate 201 side or the gallium oxide layer 203 side.

The iron (III) oxide layer 202 and the gallium oxide layer 203 of the substance 200 are produced by the mist CVD method in the method for producing a gallium oxide film of the present invention, and are therefore advantageous in terms of cost. Here, an example of a film forming apparatus by the mist CVD method and the film forming method is shown below.

(Film Forming Apparatus)

Figure 2:
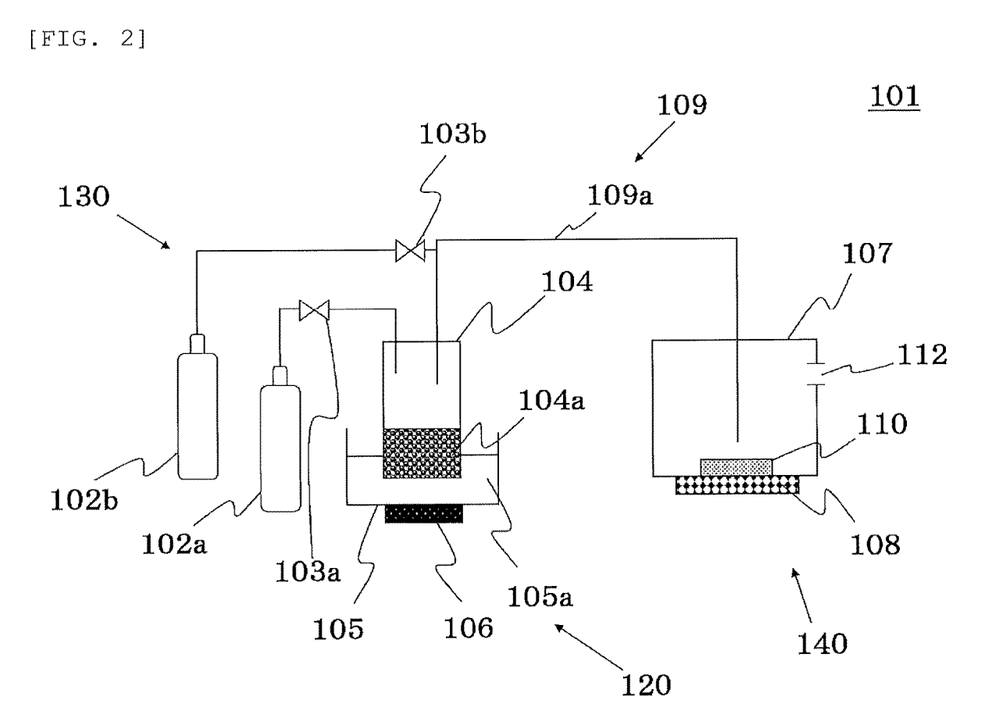
FIG. 2 is a schematic configuration diagram showing an example of a film forming apparatus that can be used in the method for producing a gallium oxide film according to the present invention.

FIG. 2 shows an example of a film forming apparatus 101 that can be used in the film forming method according to the present invention. The film forming apparatus 101 has a mist-forming unit 120 that converts the raw material solution into mist to generate mist, a carrier gas supply unit 130 that supplies a carrier gas that conveys the mist, a film forming unit 140 that heat treats the mist to form a film on a substrate, and a transfer portion 109 that connects the mist-forming unit 120 and the film forming unit 140 and conveys mist by a carrier gas. Further, the film forming apparatus 101 may be controlled in its operation by providing a control unit (not shown) for controlling the whole or a part of the film forming apparatus 101.

Here, the mist in the present invention refers to a general term for fine particles of liquid dispersed in a gas, and includes those called mist, droplets, or the like.

(Raw Material Solution)

The raw material solution (aqueous solution) 104a for the iron oxide (III) layer 202 is not particularly limited as long as it contains at least iron. That is, in addition to iron, it may contain one or more metals selected from, for example, gallium, indium, aluminum, vanadium, titanium, chromium, rhodium, iridium, nickel and cobalt. A complex or salt obtained by dissolving or dispersing the metal in water can be preferably used. As examples of the form of the complex, an acetylacetonate complex, a carbonyl complex, an ammine complex, and a hydride complex can be mentioned. As examples of the salt form, metal chloride salt, metal bromide salt, metal iodide salt or the like can be mentioned. Further, a metal obtained by dissolving the above metal in hydrobromic acid, hydrochloric acid, hydroiodic acid or the like can also be used as an aqueous salt solution. The solute concentration is preferably 0.001 to 1 mol/L.

The raw material solution (aqueous solution) 104a for the gallium oxide layer 203 is not particularly limited as long as it contains at least gallium. That is, in addition to gallium, it may contain one or more metals selected from, for example, iron, indium, aluminum, vanadium, titanium, chromium, rhodium, iridium, nickel and cobalt. A complex or salt obtained by dissolving or dispersing the metal in water can be preferably used. As examples of the form of the complex, an acetylacetonate complex, a carbonyl complex, an ammine complex, and a hydride complex can be mentioned. As examples of the salt form, metal chloride salt, metal bromide salt, metal iodide salt or the like can be mentioned. Further, a metal obtained by dissolving the above metal in hydrobromic acid, hydrochloric acid, hydroiodic acid or the like can also be used as an aqueous salt solution. The solute concentration is preferably 0.01 to 1 mol/L.

The raw material solution 104a for the gallium oxide layer 203 may contain a dopant in order to control the conductivity. This dopant is not particularly limited. As examples, n-type dopants such as tin, germanium, silicon, titanium, zirconium, vanadium or niobium, or p-type dopants such as copper, silver, tin, iridium and rhodium can be mentioned.

(Mist-Forming Unit)

In the mist-forming unit 120, the raw material solution 104a is converted into mist to generate mist. A mist-forming means is not particularly limited as long as the raw material solution 104a can be converted to mist, and may be a known mist-forming means, but it is preferable to use a mist-forming means by ultrasonic vibration. This is because it can be made into mist more stably. The frequency of the ultrasonic wave is preferably 1 to 3 MHz, but is not limited to this as long as it can be made into mist.

Figure 3:
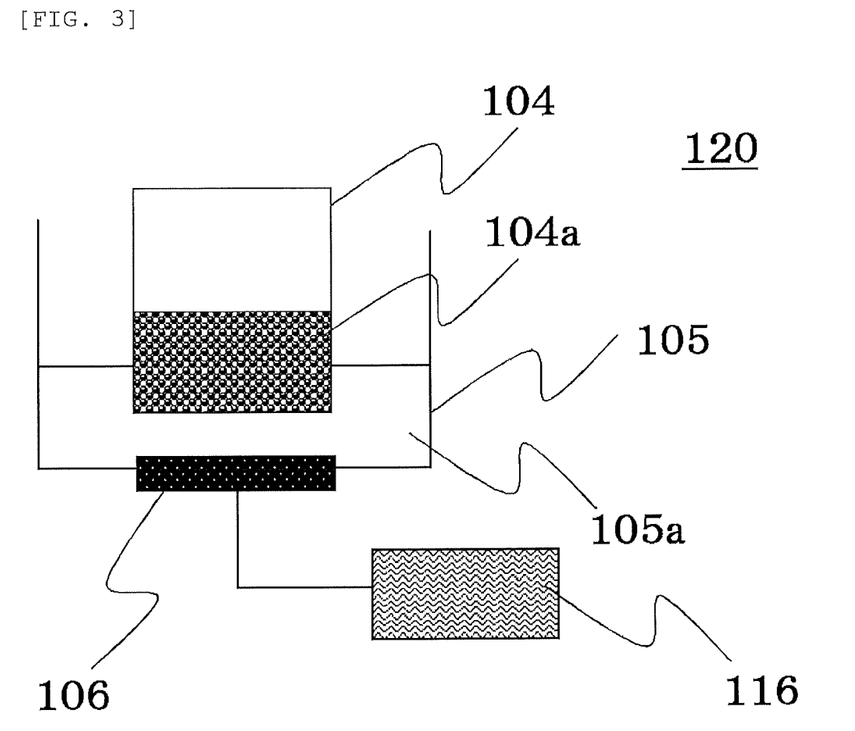
FIG. 3 is a diagram illustrating an example of a mist-forming unit in a film forming apparatus.

An example of such a mist-forming unit 120 is shown in FIG. 3. For example, a mist generation source 104 in which the raw material solution 104a is housed, a container 105 in which a medium capable of transmitting ultrasonic vibration, for example, water 105a is contained, and an ultrasonic vibrator 106 attached to the bottom surface of the container 105 may be included. Specifically, the mist generation source 104 consisting of a container containing the raw material solution 104a is housed in the container 105 containing the water 105a by using a support (not shown). An ultrasonic vibrator 106 is provided at the bottom of the container 105, and the ultrasonic vibrator 106 and a oscillator 116 are connected to each other. Then, it is configured that when the oscillator 116 is operated, the ultrasonic vibrator 106 vibrates, the ultrasonic waves propagate into the mist generation source 104 via the water 105a, and the raw material solution 104a becomes mist.

(Transfer Portion)

The transfer portion 109 connects the mist-forming unit 120 and the film forming unit 140. The mist is transferred by the carrier gas from the mist generation source 104 of the mist-forming unit 120 to a film forming chamber 107 of the film forming unit 140 via the transfer portion 109. The transfer portion 109 may be, for example, a supply pipe 109a. As the supply tube 109a, for example, a quartz tube, a resin tube, or the like can be used.

(Film Forming Unit)

The film forming unit 140 heats the mist to cause a thermal reaction to form a film on a part or all of the surface of the substrate 110 (that is, the substrate 201 in FIG. 1). The film forming unit 140 is provided with, for example, the film forming chamber 107, a substrate 110 is installed in the film forming chamber 107, and a hot plate 108 for heating the substrate 110 can be provided. The hot plate 108 may be provided outside the film forming chamber 107 as shown in FIG. 2, or may be provided inside the film forming chamber 107. Further, the film forming chamber 107 may be provided with an exhaust port 112 for exhaust gas at a position that does not affect the supply of mist to the substrate 110.

Further, in the present invention, the substrate 110 may be installed on the upper surface of the film forming chamber 107 for face-down, or the substrate 110 may be installed on the bottom surface of the film-forming chamber 107 for face-up.

The thermal reaction may be such that the mist reacts by heating, and the reaction conditions and the like are not particularly limited. It can be appropriately set according to the raw material and the film to be formed. For example, the heating temperature can be in a range of 100 to 700° C., preferably in a range of 200° C. to 650° C., and more preferably in a range of 300° C. to 600° C.

The thermal reaction may be carried out under any of a vacuum, a oxygen-free atmosphere, a reducing gas atmosphere, an air atmosphere and an oxygen atmosphere, and may be appropriately set according to the film to be formed. Further, the reaction may be carried out under any condition in reaction pressure of atmospheric pressure, pressurized or reduced pressure, but the film formation under atmospheric pressure is preferable because the apparatus configuration can be simplified.

As will be described later, in the case of film formation, the iron (III) oxide layer is first formed for a predetermined time, and then the gallium oxide layer is formed.

(Carrier Gas Supply Unit)

The carrier gas supply unit 130 has a carrier gas source 102a for supplying the carrier gas, and a flow rate control valve 103a for adjusting the flow rate of the carrier gas (hereinafter referred to as "main carrier gas") sent out from the carrier gas source 102a may be provided. Further, it is also possible to provide a carrier gas for dilution source 102b for supplying a carrier gas for dilution as needed, and a flow rate control valve 103b for adjusting the flow rate of the carrier gas for dilution sent out from the carrier gas for dilution source 102b.

The type of carrier gas is not particularly limited and can be appropriately selected depending on the film to be formed. For example, oxygen, ozone, an inert gas such as nitrogen or argon, or a reducing gas such as hydrogen gas or forming gas can be mentioned. Further, the type of carrier gas may be one type or two or more types. For example, a diluted gas obtained by diluting the same gas as the first carrier gas with another gas (for example, diluted 10-fold) may be further used as the second carrier gas, or air may be used.

The flow rate of the main carrier gas and the flow rate of the carrier gas for dilution are appropriately determined depending on the size of the film forming chamber and the substrate, but are usually 1 to 20 L/min, preferably 2 to 10 L/min.

(Film Forming Method)

Next, an example of a film forming method by the mist CVD method will be described with reference to FIG. 2. First, the raw material solution 104a is housed in the mist generation source 104 of the mist-forming unit 120, the substrate 110 is placed directly or via the wall of the film forming chamber 107 on the hot plate 108, and the hot plate 108 is operated.

Next, the flow control valves 103a and 103b are opened to supply the carrier gas into the film forming chamber 107 from the carrier gas source 102a and the carrier gas for dilution source 102b, and the atmosphere of the film forming chamber 107 is sufficiently replaced with the carrier gas. At the same time, the flow rate of the main carrier gas and the flow rate of the carrier gas for dilution are adjusted respectively to control the carrier gas flow rate.

In a step of generating mist, the ultrasonic vibrator 106 is vibrated and the vibration is propagated to the raw material solution 104a through water 105a to mist the raw material solution 104a and generate mist. Next, in a step of transferring the mist by the carrier gas, the mist is transferred from the mist-forming unit 120 to the film forming unit 140 via the transfer portion 109 by the carrier gas, and is introduced into the film forming chamber 107. The mist introduced into the film forming chamber 107 in the step of forming a film is heat treated by the heat of the hot plate 108 in the film forming chamber 107 and undergoes a thermal reaction to form a film on the main surface of the substrate 110.

By such a mist CVD method, at least the iron (III) oxide layer 202 is formed on the substrate 110 (the substrate 201 in FIG. 1), and then the gallium oxide layer 203 is formed. In this way, the substance 200 can be obtained.

Then, with respect to such a substance 200, in the method for producing a gallium oxide film of the present invention, the gallium oxide layer 203 and the substrate 201 are separated by the iron (III) oxide layer 202 by irradiation with light. Hereinafter, this separation (peeling) step will be described in detail.

(Peeling)

As shown in FIG. 1, for example, the substance 200 is irradiated with light from the gallium oxide layer 203 side (irradiation light 205).

The wavelength of the irradiation light 205 preferably includes light of 600 nm or less. By using light having such a wavelength, the irradiation light 205 can be more reliably absorbed by the iron (III) oxide layer 202, and the peeling efficiency can be further improved. Further, the lower limit of the wavelength of the light contained in the irradiation light 205 may be larger than 0 nm, and is not particularly limited, but smaller wavelength is better from the viewpoint of absorption efficiency and peeling efficiency.

Further, as the light source of the irradiation light 205, a halogen lamp, a low pressure discharge lamp, a high pressure discharge lamp or the like may be used, but the laser or the flash lamp is preferable because it can give a high energy density in a short time to the substance 200, particularly the iron (III) oxide layer 202. If the laser light or the flash lamp light is used, the peeling step can be performed with high productivity.

As the laser source, a second harmonic of such as a YAG system, a $YVO_4$ system, or a $GdVO_4$ system can be used. The substrate temperature at the time of laser irradiation may be room temperature, but may be raised to 100 to 500° C. By heating, thermal expansion during film formation is alleviated, and there is no risk of thermal strain, cracks, and the like. The laser conditions can be appropriately determined, and for example, an output power can be 0.01 to 20 W, a frequency can be 10 to 500 kHz, a galvo head can be provided, and a scanning speed can be 1 to 5000 mm/sec.

In case of the flash lamp, it can be made a substance temperature of room temperature to 300° C. and a processing time of 0.01 to 1000 milliseconds, for example. It is unavoidable that the wavelength of the flash lamp has a certain wavelength range as long as it is a lamp, but it is desirable that the flash lamp has a peak intensity in a wavelength range of 700 nm or less. As a lamp light source that matches this wavelength range, heating with a xenon lamp is common. Since the flash lamp can effectively heat treat a large area in a short time, there is no possibility of thermal strain, cracks, and the like.

The irradiation light 205 may be irradiated from the upper side of the substance 200, that is, from the gallium oxide layer 203 side as shown in FIG. 1, or when the substrate 201 is transparent, it may be irradiated from the substrate 201 side, that is, the bottom in FIG. 1. By this method, the gallium oxide layer 203 can be easily separated from the substrate 201 to obtain a gallium oxide film.

Figure 4:
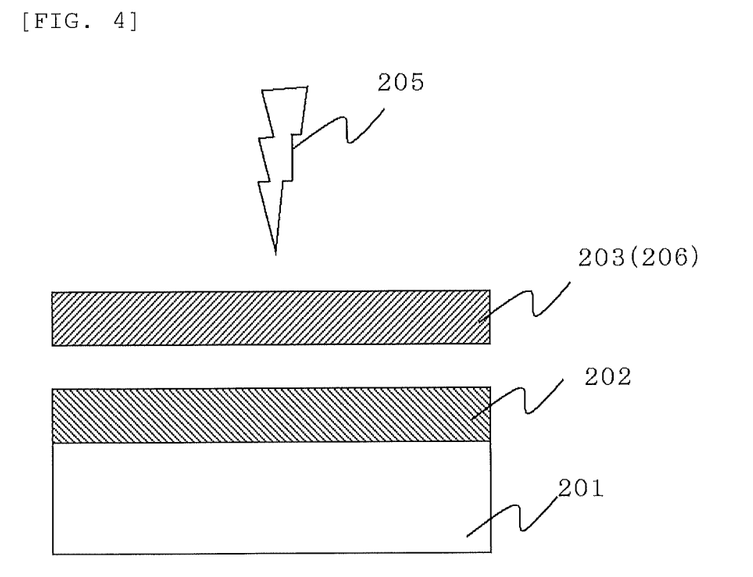
FIG. 4 is an explanatory diagram showing a state of separation between the gallium oxide layer and the substrate by light irradiation from the gallium oxide layer side.
Figure 5:
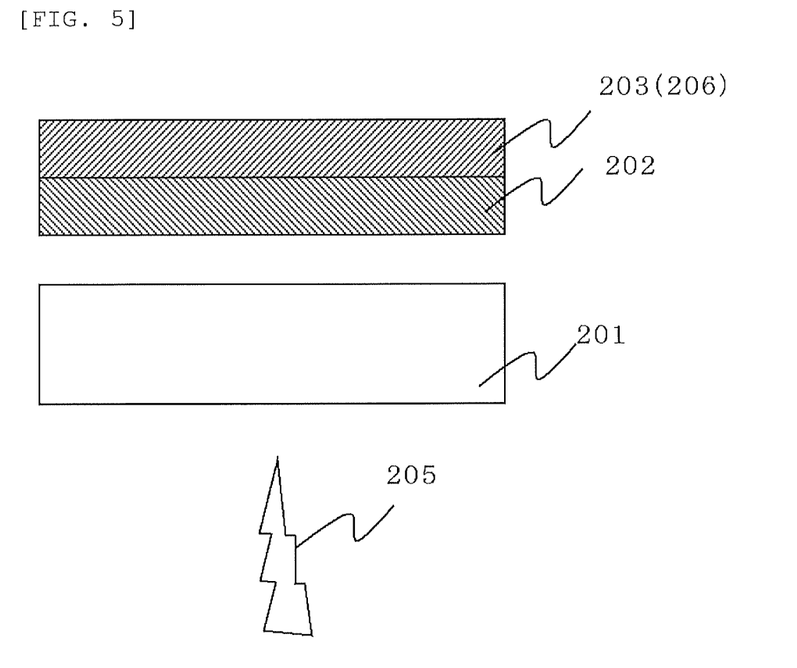
FIG. 5 is an explanatory diagram showing a state of separation between the gallium oxide layer and the substrate by light irradiation from the substrate side.

FIGS. 4 and 5 show the state of separation of this gallium oxide layer.

In the former case, as shown in FIG. 4, the portion of the iron (III) oxide layer 202 at the gallium oxide layer 203 side absorbs the irradiation light 205 and is decomposed into iron and oxygen or dissolved and resolidified to become poly-crystallized, and the adhesion strength decreases, then the gallium oxide layer 203 is peeled off from the substrate 201 to produce the gallium oxide film 206.

On the other hand, in the latter case, as shown in FIG. 5, the portion of the iron (III) oxide layer 202 at the substrate 201 side absorbs the irradiation light 205 and is decomposed or dissolved and resolidified to become poly-crystallized, and the adhesion strength decreases, and the gallium oxide layer 203 is peeled off from the substrate 201 together with the iron (III) oxide layer 202 to produce a gallium oxide film 206 with the iron (III) oxide layer. The attached iron (III) oxide layer may be removed if necessary.

It is also possible to perform the light irradiation treatment after adhering another substrate supporting the gallium oxide film 206 to the gallium oxide layer 203 in advance before peeling. By doing so, the substrate can be replaced.

The gallium oxide film obtained as described above can be suitably used for a horizontal or vertical semiconductor device. In particular, it is preferably used for vertical semiconductor devices.

EXAMPLE

Hereinafter, the present invention will be described in detail with reference to examples, but this is not limited to the present invention.

Example 1

Based on the method for producing a gallium oxide film of the present invention, first, film formation of a laminated body of iron oxide ($\alpha$-Fe$_2$O$_3$)/gallium oxide ($\alpha$-Ga$_2$O$_3$) on a substrate (c-plane sapphire substrate) using the film forming apparatus 101 shown in FIGS. 2-3 was performed.

Iron (III) oxide layer formation: An aqueous solution prepared by mixing a 35% hydrogen chloride aqueous solution at a volume ratio of 2% was mixed with iron acetylacetonate so as to be 0.05 mol/L, which was used as a raw material solution 104a.

The obtained raw material solution 104a was housed in the mist generation source 104. Next, a 4-inch (diameter 100 mm) c-plane sapphire substrate was placed on the hot plate 108 in the film forming chamber 107 as the substrate 110, and the hot plate 108 was operated to raise the temperature to 550° C.

Subsequently, the flow control valves 103a and 103b were opened to supply air as a carrier gas from the carrier gas source 102a and the carrier gas for dilution source 102b into the film forming chamber 107, and the atmosphere of the film forming chamber 107 was sufficiently filled with the carrier gas. At the same time, the flow rate of the main carrier gas was adjusted to 2 L/min and the flow rate of the carrier gas for dilution was adjusted to 5 L/min.

Next, the ultrasonic vibrator 106 was vibrated at 2.4 MHz, and the vibration was propagated to the raw material solution 104a through water 105a to mist the raw material solution 104a to generate mist. This mist was introduced into the film forming chamber 107 through the supply pipe 109a by the carrier gas. A thin film of iron oxide ($\alpha$-Fe$_2$O$_3$) was formed on the substrate 110 by thermally reacting the mist in the film forming chamber 107 under the condition of atmospheric pressure and 550° C. The film formation time was 60 minutes. After the film formation, the temperature was changed to 450° C. while the substrate was kept waiting in the chamber, and the gallium oxide layer was subsequently formed by the following process.

Gallium oxide layer formation: An aqueous solution of gallium iodide adjusted to be 0.05 mol/L was used as a raw material solution 104a.

After that, the film was formed in almost the same procedure as the iron (III) oxide layer film formation. Specifically, the obtained raw material solution 104a was housed in the mist generation source 104. Subsequently, the flow control valves 103a and 103b were opened to supply nitrogen gas as a carrier gas from the carrier gas source 102a and the carrier gas for dilution source 102b into the film forming chamber 107, and the atmosphere of the film forming chamber 107 was sufficiently filled with the carrier gas. The flow rate of the main carrier gas was adjusted to 2 L/min, and the flow rate of the carrier gas for dilution was adjusted to 5 L/min.

Next, the ultrasonic vibrator 106 was vibrated at 2.4 MHz, and the vibration was propagated to the raw material solution 104a through water 105a to mist the raw material solution 104a to generate mist. This mist was introduced into the film forming chamber 107 through the supply pipe 109a by the carrier gas. The mist was thermally reacted in the film forming chamber 107 under atmospheric pressure at 450° C. to form a thin film of gallium oxide ($\alpha$-Ga$_2$O$_3$) having a corundum structure on the substrate 110. The film formation time was 60 minutes.

The film thickness (layer thickness) of the obtained substance was analyzed using a spectroscopic ellipsometer. As a result of the analysis, the iron (III) oxide layer was 1.1 μm and the gallium oxide layer was 1.2 μm. Further, the peaks of $\alpha$-Fe$_2$O$_3$ and $\alpha$-Ga$_2$O$_3$ were confirmed by X-ray diffraction, respectively, and when the locking curve was measured for the $\alpha$-Ga$_2$O$_3$ peak, the half-value width was 12 seconds. It can be seen that a gallium oxide layer having extremely good crystallinity has been obtained.

The obtained substance was irradiated with a laser from the substrate side. The light source was a second harmonic of Nd:YVO$_4$ (wavelength 532 nm), the output power was 0.1 W, the frequency was 100 kHz, and the scan speed was 5 mm/sec. It was confirmed that the gallium oxide layer could be easily peeled off by laser irradiation and the gallium oxide film was obtained.

Example 2

In Example 1, four samples were prepared in which the film formation time of the iron (III) oxide layer was 15 minutes. Other than this, film formation, evaluation, and laser irradiation were performed under the same conditions as in Example 1. As a result of the film thickness analysis, the iron (III) oxide layer was 0.23 μm on average, and the gallium oxide layer was 1.1 μm on average. The half-value width of the locking curve of the $\alpha$-$Ga_2O_3$ peak by X-ray diffraction was good at 11 to 14 seconds. When the obtained one sample was irradiated with a laser, it was confirmed that the gallium oxide layer could be easily peeled off by the laser irradiation and the gallium oxide film was obtained.

COMPARATIVE EXAMPLE

In Example 1, a substance which was not formed an iron (III) oxide layer, namely, a substance containing only a gallium oxide layer was prepared. Other than this, film formation and evaluation were performed under the same conditions as in Example 1, and laser irradiation was performed. As a result of the film thickness analysis, the gallium oxide layer was 1.2 μm. The half-value width of the locking curve of the $\alpha$-$Ga_2O_3$ peak by X-ray diffraction was good at 13 seconds, but no change was observed in the sample even after laser irradiation, the gallium oxide layer could not be peeled off, and no gallium oxide film could be obtained.

Example 3

For one sample obtained in Example 2, the laser wavelength irradiating the substance was set to 1064 nm. It was confirmed that the gallium oxide layer could be peeled off by laser irradiation and the gallium oxide film was obtained.

Example 4

One sample obtained in Example 2 was irradiated with a halogen lamp as a flash lamp for 10 milliseconds. It was confirmed that the gallium oxide layer could be peeled off by lamp irradiation and the gallium oxide film was obtained.

Example 5

One sample obtained in Example 2 was irradiated with a xenon lamp as a flash lamp for 1 millisecond. It was confirmed that the gallium oxide layer could be peeled off by lamp irradiation and the gallium oxide film was obtained.

As described above, by interposing the iron (III) oxide layer between the substrate and the gallium oxide layer, the gallium oxide layer can be easily peeled off by light irradiation to obtain a gallium oxide film. Further, the obtained gallium oxide film has extremely good crystallinity.

Example 6

In Example 2, an InGaO layer was formed instead of the gallium oxide layer. Other than this, film formation and laser irradiation were performed under the same conditions as in Example 2. When the obtained sample was irradiated with a laser, it was confirmed that the InGaO layer could be easily peeled off by the laser irradiation and the InGaO film was obtained.

As described above, by interposing the iron (III) oxide layer, which is a light absorbing layer, between the substrate and the InGaO layer, which is a crystalline oxide semiconductor layer, the InGaO layer is easily peeled off by the light irradiation to obtain an InGaO film.

Example 7

In Example 2, a chromium oxide layer was formed in place of the iron (III) oxide layer. Other than this, film formation, evaluation, and laser irradiation were performed under the same conditions as in Example 2. It was confirmed by X-ray diffraction that $\alpha$-$Ga_2O_3$ was formed. When the obtained sample was irradiated with a laser, it was confirmed that the gallium oxide layer could be easily peeled off by the laser irradiation and the gallium oxide film was obtained.

Example 8

In Example 2, a vanadium oxide layer was formed in place of the iron (III) oxide layer. Other than this, film formation, evaluation, and laser irradiation were performed under the same conditions as in Example 2. It was confirmed by X-ray diffraction that $\alpha$-$Ga_2O_3$ was formed. When the obtained sample was irradiated with a laser, it was confirmed that the gallium oxide layer could be easily peeled off by the laser irradiation and the gallium oxide film was obtained.

Example 9

In Example 2, a titanium oxide layer was formed in place of the iron (III) oxide layer. Other than this, film formation, evaluation, and laser irradiation were performed under the same conditions as in Example 2. It was confirmed by X-ray diffraction that $\alpha$-$Ga_2O_3$ was formed. When the obtained sample was irradiated with a laser, it was confirmed that the gallium oxide layer could be easily peeled off by the laser irradiation and the gallium oxide film was obtained.

Example 10

In Example 2, the substrate was a lithium tantalate substrate instead of the c-plane sapphire substrate. Other than this, film formation, evaluation, and laser irradiation were performed under the same conditions as in Example 2. It was confirmed by X-ray diffraction that $\alpha$-$Ga_2O_3$ was formed. When the obtained sample was irradiated with a laser, it was confirmed that the gallium oxide layer could be easily peeled off by the laser irradiation and the gallium oxide film was obtained.

As described above, by interposing the light absorbing layer between the substrate and the gallium oxide layer, the gallium oxide layer can be easily peeled off by the light irradiation to obtain a gallium oxide film.

The present invention is not limited to the above embodiment. The above-described embodiments are just examples, and any examples that substantially have the same feature and demonstrate the same functions and effects as those in the technical concept disclosed in claims of the present invention are included in the technical scope of the present invention.

The invention claimed is:

1. A method for producing a gallium oxide film, wherein, to a substance in which an ferric oxide layer and a gallium oxide layer are formed in this order by a mist CVD method on the surface of a substrate having a single crystal structure, light is irradiated from the gallium oxide layer side to cause separation between the gallium oxide layer and the substrate at the ferric oxide layer, and the gallium oxide film is produced by the separation of the gallium oxide layer.

2. The method for producing a gallium oxide film according to claim 1, wherein the thickness of the ferric oxide layer is 1 to 500 nm.

3. The method for producing a gallium oxide film according to claim 1, wherein the light to be irradiated includes light having a wavelength of 600 nm or less.

4. The method for producing a gallium oxide film according to claim 2, wherein the light to be irradiated includes light having a wavelength of 600 nm or less.

5. The method for producing a gallium oxide film according to claim 1, wherein the light to be irradiated is a laser beam.

6. The method for producing a gallium oxide film according to claim 2, wherein the light to be irradiated is a laser beam.

7. The method for producing a gallium oxide film according to claim 3, wherein the light to be irradiated is a laser beam.

8. The method for producing a gallium oxide film according to claim 4, wherein the light to be irradiated is a laser beam.

9. The method for producing a gallium oxide film according to claim 1, wherein the light to be irradiated is a flash lamp light.

10. The method for producing a gallium oxide film according to claim 2, wherein the light to be irradiated is a flash lamp light.

11. The method for producing a gallium oxide film according to claim 3, wherein the light to be irradiated is a flash lamp light.

12. The method for producing a gallium oxide film according to claim 4, wherein the light to be irradiated is a flash lamp light.

13. The method for producing a gallium oxide film according to claim 1, wherein the diameter of the substrate is 50 mm or more.

14. A method for producing a vertical semiconductor device which comprises producing a vertical semiconductor device using the gallium oxide film produced by the method for producing a gallium oxide film according to claim 1.

* * * * *